United States Patent
Kaneko et al.

(10) Patent No.: US 10,796,886 B2
(45) Date of Patent: Oct. 6, 2020

(54) DETECTION DEVICE, MICROWAVE OUTPUT DEVICE AND PLASMA PROCESSING APPARATUS

(71) Applicant: TOKYO ELECTRON LIMITED, Tokyo (JP)

(72) Inventors: Kazushi Kaneko, Miyagi (JP); Yohei Ishida, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/523,066

(22) Filed: Jul. 26, 2019

(65) Prior Publication Data
US 2020/0035462 A1    Jan. 30, 2020

(30) Foreign Application Priority Data

Jul. 27, 2018 (JP) .................................. 2018-140867

(51) Int. Cl.
| | | |
|---|---|---|
| *H01J 37/32* | (2006.01) | |
| *H01P 5/18* | (2006.01) | |
| *H01P 3/06* | (2006.01) | |
| *H01P 3/10* | (2006.01) | |
| *H01P 3/16* | (2006.01) | |
| *H01P 3/12* | (2006.01) | |
| *H01P 5/12* | (2006.01) | |

(52) U.S. Cl.
CPC .. *H01J 37/32201* (2013.01); *H01J 37/32229* (2013.01); *H01P 3/06* (2013.01); *H01P 5/18* (2013.01); *H01J 2237/24507* (2013.01)

(58) Field of Classification Search
CPC .... H01P 3/10; H01P 3/16; H01P 5/087; H01P 3/12; H01P 5/12; H01P 5/188; H01P 5/04; H01P 5/08; H01P 5/00; H01P 1/16; H01P 3/127; H01P 5/107
See application file for complete search history.

(56) References Cited

U.S. PATENT DOCUMENTS 6,029,051 A * 2/2000 Osterberg .............. G01R 27/28
324/142

FOREIGN PATENT DOCUMENTS

JP        2017-073339 A    4/2017

* cited by examiner

*Primary Examiner* — Wei (Victor) Y Chan
(74) *Attorney, Agent, or Firm* — Rothwell, Figg, Ernst & Manbeck, P.C.

(57) ABSTRACT

A detection device includes a substrate on which a connector connected to a transmission line for microwaves, a detection circuit configured to convert the microwaves inputted from the transmission line via the connector to a detection value indicating power of the microwaves, and an output port configured to output the detection value obtained by the detection circuit are disposed. The detection device further includes a housing that has a first opening and a second opening and accommodates the substrate in a state where the connector is inserted into the first opening and the output port is inserted into the second opening. The detection device further includes a first sealing member provided at the first opening of the housing to seal a periphery of the connector; and a second sealing member provided at the second opening of the housing to seal a periphery of the output port.

10 Claims, 11 Drawing Sheets

DETECTION DEVICE, MICROWAVE OUTPUT DEVICE AND PLASMA PROCESSING APPARATUS

CROSS-REFERENCE TO RELATED APPLICATIONS

This application claims priority to Japanese Patent Application No. 2018-140867 filed on Jul. 27, 2018, the entire contents of which are incorporated herein by reference.

TECHNICAL FIELD

The present disclosure relates to a detection device, a microwave output device, and a plasma processing apparatus.

BACKGROUND

Conventionally, there is known a plasma processing apparatus for exciting a gas by microwaves (see, e.g., Japanese Patent Application Publication No. 2017-73339). In this plasma processing apparatus, a microwave output device for outputting microwaves having a single frequency or microwaves having a given bandwidth may be used.

The microwave output device includes, e.g., a microwave generation unit and an output unit. Microwaves generated in the microwave generation unit propagate through a waveguide and then are outputted from the output unit to a load such as a chamber body of the plasma processing apparatus, or the like. In the microwave output device, a directional coupler is disposed between the microwave generation unit and the output unit, and power of the microwaves split by the directional coupler is detected by a detection device.

SUMMARY

In accordance with an aspect of the present application, there is provided a detection device including: a substrate on which a connector connected to a transmission line for microwaves, a detection circuit configured to convert the microwaves inputted from the transmission line via the connector to a detection value indicating power of the microwaves, and an output port configured to output the detection value obtained by the detection circuit are disposed; a housing that has a first opening and a second opening and accommodates the substrate in a state where the connector is inserted into the first opening and the output port is inserted into the second opening; a first sealing member provided at the first opening of the housing to seal a periphery of the connector; and a second sealing member provided at the second opening of the housing to seal a periphery of the output port.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
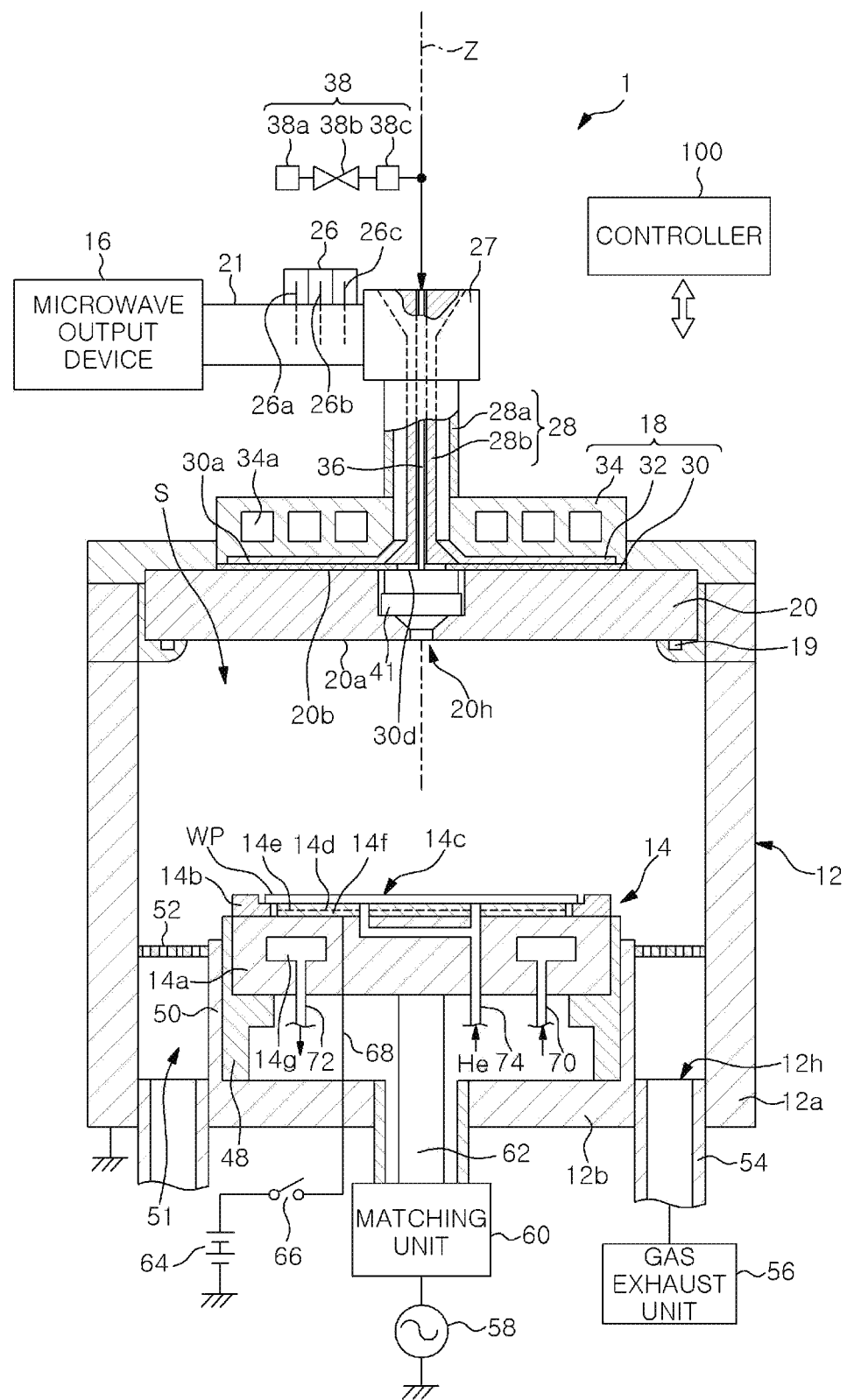
FIG. 1 shows a configuration example of a plasma processing apparatus according to an embodiment.

Hereinafter, embodiments will be described in detail with reference to the accompanying drawings. Like reference numerals will be given to like or corresponding parts throughout the drawings.

Conventionally, there is known a plasma processing apparatus for exciting a gas by microwaves. In this plasma processing apparatus, a microwave output device for outputting the microwaves having a single frequency or microwaves having a given bandwidth may be used.

The microwave output device includes, e.g., a microwave generation unit and an output unit. The microwaves generated in the microwave generation unit propagate through a waveguide and outputted from the output unit to a load such as a chamber body of the plasma processing apparatus, or the like. In the microwave output device, a directional coupler is disposed between the microwave generation unit and the output unit, and power of the microwaves split by the directional coupler is detected by a detection device.

The detection device includes a connector connected to a transmission line for microwaves, a detection circuit for converting the microwaves inputted from the transmission line via the connector to a detection value indicating power of the microwaves, and a substrate on which an output port for outputting the detection value obtained by the detection circuit is disposed. The substrate is accommodated in a housing serving as a shield against electromagnetic waves in order to avoid deterioration of detection accuracy of the power of the microwaves due to the influence of the electromagnetic waves other than the microwaves. A connector opening and an output port opening are formed at the housing. The substrate is accommodated in the housing in a state where the connector is inserted into the connector opening and the output port is inserted into the output port opening.

In the detection device, in order to improve assemblability, given gaps exist between an inner wall surface of the connector opening and the connector and between an inner wall surface of the output port opening and the output port. In the detection device, moisture in the air may intrude into the housing through these gaps. The moisture that has intruded into the housing is absorbed by the substrate accommodated in the housing. The moisture absorbed by the substrate affects characteristics of the detection circuit disposed on the substrate, which results in deterioration of the detection accuracy of the power of the microwaves.

(Configuration Example of Plasma Processing Apparatus)

FIG. 1 shows a configuration example of a plasma processing apparatus 1 according to an embodiment. The plasma processing apparatus 1 shown in FIG. 1 includes a chamber body 12 and a microwave output device 16. The plasma processing apparatus 1 may further include a stage 14, an antenna 18, and a dielectric window 20.

The chamber body 12 has therein a processing space S. The chamber body 12 has a sidewall 12a and a bottom portion 12b. The sidewall 12a is formed in a substantially cylindrical shape. The central axis of the sidewall 12a substantially coincides with the Z-axis extending in a vertical direction. The bottom portion 12b is disposed at a side of a lower end of the sidewall 12a. A gas exhaust hole 12h is formed at the bottom portion 12b. The sidewall 12a has an upper opening.

A dielectric window 20 is disposed on the upper end portion of the sidewall 12a. The dielectric window 20 has a bottom surface 20a facing the processing space S. The dielectric window 20 blocks the upper opening of the sidewall 12a. An O-ring 19 is disposed between the dielectric window 20 and the upper end portion of the sidewall 12a. The O-ring 19 airtightly seals the chamber body 12.

The stage 14 is accommodated in the processing space S. The stage 14 faces the dielectric window 20 in the vertical direction. The processing space S is disposed between the dielectric window 20 and the stage 14. The stage 14 is configured to support a target object WP (e.g., wafer) mounted thereon.

In one embodiment, the stage 14 includes a base 14a and an electrostatic chuck 14c. The base 14a has a substantially disk shape, and is made of a conductive material such as aluminum. The central axis of the base 14a substantially coincides with the Z-axis. The base 14a is supported by a cylindrical support 48. The cylindrical support 48 is made of an insulating material and extends vertically upward from the bottom portion 12b. A conductive cylindrical support 50 surrounds an outer periphery of the cylindrical support 48. The cylindrical support 50 extends vertically upward from the bottom portion 12b of the chamber body 12 along the outer periphery of the cylindrical support 48. An annular gas exhaust passage 51 is formed between the cylindrical support 50 and the sidewall 12a.

A baffle plate 52 is provided at an upper portion of the gas exhaust passage 51. The baffle plate 52 has an annular shape. The baffle plate 52 has a plurality of through-holes penetrating therethrough in a thickness direction thereof. The above-described gas exhaust hole 12h is disposed below the baffle plate 52. A gas exhaust unit 56 is connected to the gas exhaust hole 12h through a gas exhaust line 54. The gas exhaust unit 56 includes an automatic pressure control valve (APC) and a vacuum pump such as a turbo molecular pump. The gas exhaust unit 56 can reduce a pressure in the processing space S to a desired vacuum level.

The base 14a serves as a high frequency electrode. A high frequency power supply 58 for RF bias is electrically connected to the base 14a via a power feed rod 62 and a matching unit 60. The high frequency power supply 58 outputs a high frequency power having a frequency, e.g., 13.56 MHz, suitable for controlling the energy of ions to be attracted to the target object WP (hereinafter, referred to as "high frequency for bias") at a preset power level. The matching unit 60 includes a matching device for matching the impedance of the high frequency power supply 58 side and the impedance of the load side that is mainly the electrode, plasma, and the chamber body 12. The matching device includes a blocking capacitor for self-bias generation.

The electrostatic chuck 14c is disposed on the upper surface of the base 14a. The electrostatic chuck 14c holds the target object WP by an electrostatic attractive force. The electrostatic chuck 14c includes an electrode 14d, an insulating film 14e, and an insulating film 14f, and has a substantially disk shape. The central axis of the electrostatic chuck 14c substantially coincides with the Z-axis. The electrode 14d of the electrostatic chuck 14c is made of a conductive film and is embedded between the insulating films 14e and 14f. A DC power supply 64 is electrically connected to the electrode 14d via a switch 66 and a coated wire 68. The electrostatic chuck 14c can attract and hold the target object WP by using a Coulomb force generated by the DC voltage applied from the DC power supply 64. A focus ring 14b is disposed on the base 14a. Further, the focus ring 14b surrounds the target object WP and the electrostatic chuck 14c.

A coolant channel 14g is disposed in the base 14a. The coolant channel 14g extends about the Z-axis, for example. A coolant from a chiller unit is supplied to the coolant channel 14g through a line 70. The coolant supplied to the coolant channel 14g returns to the chiller unit through a line 72. By controlling a temperature of the coolant by the chiller unit, a temperature of the electrostatic chuck 14c and hence a temperature of the target object WP are controlled.

A gas supply line 74 is formed in the stage 14. The gas supply line 74 is provided to supply a heat transfer gas, e.g., He gas, to a gap between an upper surface of the electrostatic chuck 14c and a backside of the target object WP.

The microwave output device 16 outputs microwaves for exciting a processing gas supplied into the chamber body 12. The microwave output device 16 is configured to variably control a frequency, a power, and a bandwidth of the microwaves. The microwave output device 16 can generate microwaves of a single frequency by setting the bandwidth of the microwaves to substantially zero. Further, the microwave output device 16 can generate microwaves having a bandwidth having a plurality of frequency components. The frequency components may have the same power, or only a center frequency component in the bandwidth may have a power higher than those of other frequency components. In one example, the microwave output device 16 can control the power of the microwaves within a range from 0 W to 5000 W, the frequency or the center frequency of the microwaves within a range from 2400 MHz to 2500 MHz, and the bandwidth of the microwaves within a range from 0 MHz to 100 MHz. Further, the microwave output device 16 can control a frequency pitch (carrier pitch) of the frequency components of the microwaves in the bandwidth within a range from 0 kHz to 25 kHz.

The plasma processing apparatus 1 further includes a waveguide 21, a tuner 26, a mode transducer 27, and a coaxial waveguide 28. An output unit of the microwave output device 16 is connected to one end of the waveguide 21. The other end of the waveguide 21 is connected to the mode transducer 27. The waveguide 21 is, e.g., a rectangular waveguide. The tuner 26 is provided in the waveguide 21. The tuner 26 has stubs 26a, 26b and 26c. Each of the stubs 26a to 26c is configured to control a protruding amount thereof into the inner space of the waveguide 21. The tuner 26 controls protruding positions of the stubs 26a to 26c with respect to a reference position, thereby matching the impedance of the microwave output device 16 and the impedance of the load (e.g., the chamber body 12).

The mode transducer 27 converts a mode of the microwaves from the waveguide 21 and supplies the microwaves after the mode conversion to the coaxial waveguide 28. The coaxial waveguide 28 includes an outer conductor 28a and an inner conductor 28b. The outer conductor 28a has a substantially cylindrical shape and the central axis thereof substantially coincides with the Z-axis. The inner conductor 28b has a substantially cylindrical shape and extends inside the outer conductor 28a. The central axis of the inner conductor 28b substantially coincides with the Z-axis. The coaxial waveguide 28 transmits the microwaves from the mode converter 27 to the antenna 18.

The antenna 18 is provided on a surface 20b opposite to the bottom surface 20a of the dielectric window 20. The antenna 18 includes a slot plate 30, a dielectric plate 32, and a cooling jacket 34.

The slot plate 30 is provided on the surface 20b of the dielectric window 20. The slot plate 30 is made of a conductive metal and has a substantially disk shape. The central axis of the slot plate 30 substantially coincides with the Z-axis. A plurality of slot holes 30a is formed at the slot plate 30. In one example, the slot holes 30a form a plurality of slot pairs. Each of the slot pairs has two elongated slot holes 30a extending in directions intersecting each other. The slot pairs are arranged along one or more concentric circles about the Z-axis. A through-hole 30d through which a conduit 36 to be described later can penetrate is formed at a central portion of the slot plate 30.

The dielectric plate 32 is disposed on the slot plate 30. The dielectric plate 32 is made of a dielectric material such as quartz and has a substantially disk shape. The central axis of the dielectric plate 32 substantially coincides with the Z-axis. The cooling jacket 34 is disposed on the dielectric plate 32. The dielectric plate 32 is disposed between the cooling jacket 34 and the slot plate 30.

The cooling jacket 34 has a conductive surface. A flow path 34a is formed in the cooling jacket 34. The coolant is supplied to the flow path 34a. The lower end of the outer conductor 28a is electrically connected to an upper surface of the cooling jacket 34. The lower end of the inner conductor 28b is electrically connected to the slot plate 30 through a hole formed at central portions of the cooling jacket 34 and the dielectric plate 32.

The microwaves from the coaxial waveguide 28 propagate through the dielectric plate 32 and are supplied to the dielectric window 20 through the slot holes 30a of the slot plate 30. The microwaves supplied to the dielectric window 20 are introduced into the processing space S.

The conduit 36 passes through the inner hole of the inner conductor 28b of the coaxial waveguide 28. As described above, the through-hole 30d through which the conduit 36 can pass is formed at the central portion of the slot plate 30. The conduit 36 extends through the inner hole of the inner conductor 28b and is connected to a gas supply system 38.

The gas supply system 38 supplies a processing gas for processing the target object WP to the conduit 36. The gas supply system 38 may include a gas source 38a, a valve 38b, and a flow rate controller 38c. The gas source 38a is a source of the processing gas. The valve 38b switches start and stop of the supply of the processing gas from the gas source 38a. The flow rate controller 38c is, e.g., a mass flow controller, and controls a flow rate of the processing gas from the gas source 38a.

The plasma processing apparatus 1 may further include an injector 41. The injector 41 supplies a gas from the conduit 36 to a through-hole 20h formed in the dielectric window 20. The gas supplied to the through-hole 20h of the dielectric window 20 is supplied to the processing space S. The processing gas is excited by the microwaves introduced into the processing space S through the dielectric window 20. Accordingly, plasma is generated in the processing space S and the target object WP is processed by active species such as ions and/or radicals from the plasma.

The plasma processing apparatus 1 further includes a controller 100. The controller 100 integrally controls the respective components of the plasma processing apparatus 1. The controller 100 may include a processor such as a CPU, a user interface, and a storage unit.

The processor executes a process recipe and a program stored in the storage unit to integrally control the respective components such as the microwave output device 16, the stage 14, the gas supply system 38, the gas exhaust unit 56 and the like.

The user interface includes a keyboard or a touch panel through which a process manager inputs a command to manage the plasma processing apparatus 1, a display for visualizing and displaying an operation state of the plasma processing apparatus 1, and the like.

The storage unit stores control programs (software) for realizing various processes performed in the plasma processing apparatus 1 under the control of the processor, a process recipe including process condition data and the like. The processor reads out various control programs from the storage unit, if necessary, in response to an instruction from the user interface or the like, and executes the read-out programs. A desired process is performed in the plasma processing apparatus 1 under the control of the processor.

(Configuration Example of a Microwave Output Device)

Hereinafter, four examples of the microwave output device 16 will be described in detail.

(First Example of the Microwave Output Device)

Figure 2:
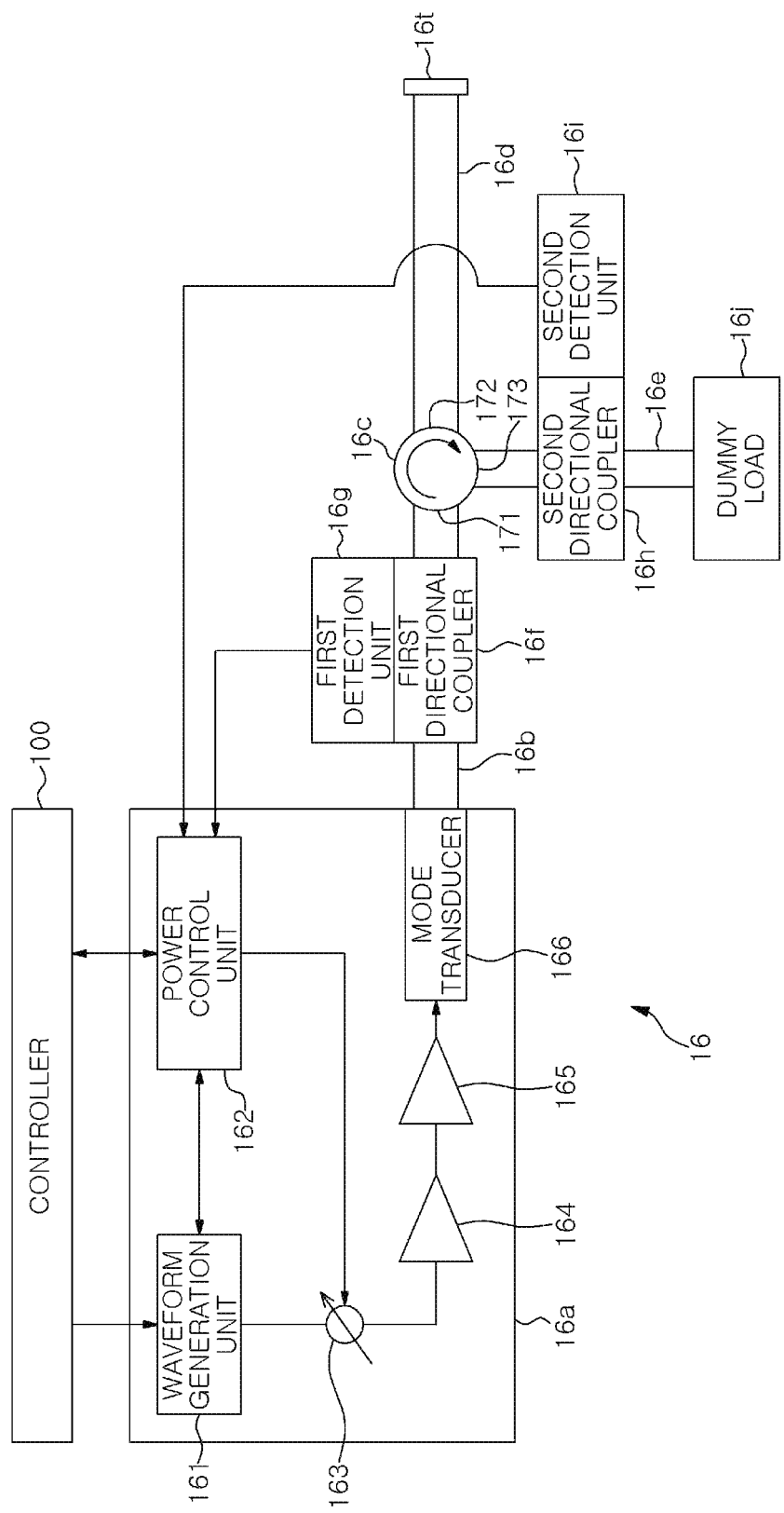
FIG. 2 shows a first example of a microwave output device.

FIG. 2 shows the first example of the microwave output device 16. The microwave output device 16 includes a microwave generation unit 16a, a waveguide 16b, a circulator 16c, and a waveguide 16d. The microwave output device 16 further includes a waveguide 16e, a first directional coupler 16f, a first detection unit 16g, a second directional coupler 16h, a second detection unit 16i, and a dummy load 16j.

The microwave generation unit 16a includes a waveform generation unit 161, a power control unit 162, an attenuator 163, amplifiers 164 and 165, and a mode transducer 166. The waveform generation unit 161 generates a waveform of microwaves. The waveform generation unit 161 is connected to the controller 100 and the power control unit 162. The waveform generation unit 161 generates microwaves having a frequency (center frequency), a bandwidth, and a carrier pitch respectively corresponding to a setting frequency, a setting bandwidth, and a setting pitch designated by the controller 100. On the assumption that the controller 100 designates the powers of the frequency components within the bandwidth via the power control unit 162, the waveform generation unit 161 may generate microwaves having frequency components with powers reflecting the powers of the frequency components designated by the controller 100.

Figure 3:
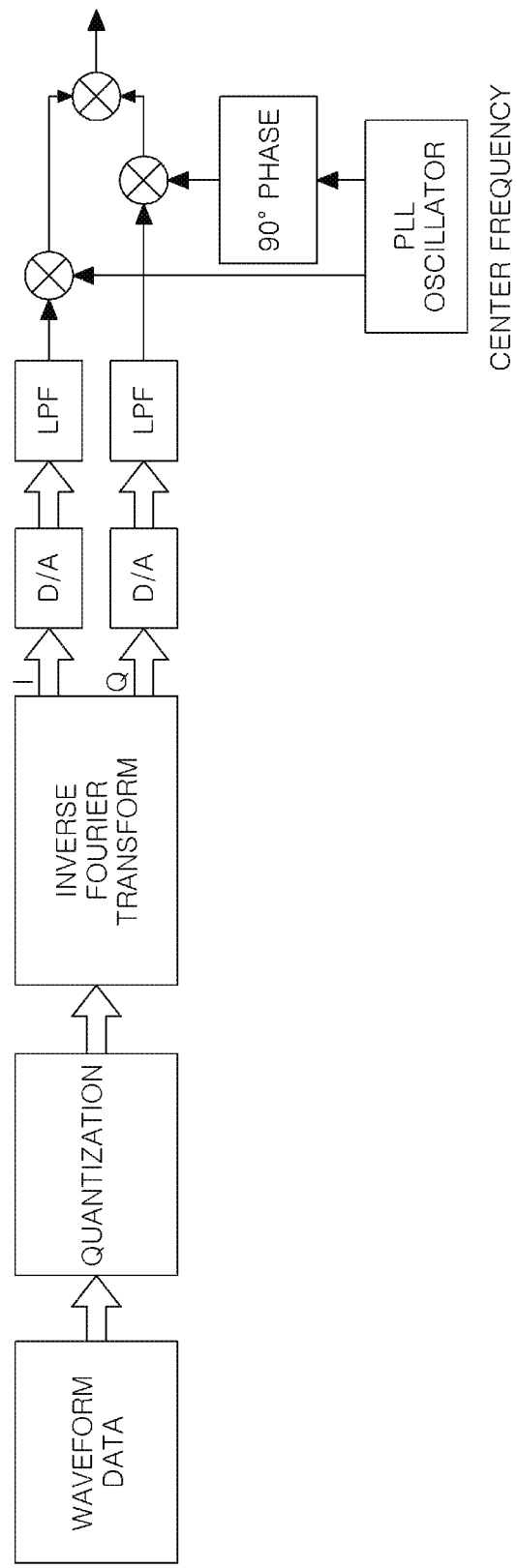
FIG. 3 explains the principle of microwave generation in a waveform generation unit.

FIG. 3 explains the principle of microwave generation in the waveform generation unit 161. The waveform generation unit 161 includes, e.g., a phase locked loop (PLL) oscillator capable of oscillating a microwave of which phase is synchronized with that of a reference frequency, and an IQ digital modulator connected to the PLL oscillator. The waveform generation unit 161 sets the frequency of the microwaves oscillated by the PLL oscillator to the setting frequency designated by the controller 100. Then, the waveform generation unit 161 modulates the microwaves from the PLL oscillator and the microwaves having a phase difference of 90° with respect to the microwaves from the PLL oscillator using the IQ digital modulator. Accordingly, the waveform generation unit 161 generates microwaves having a plurality of frequency components within the bandwidth or microwaves having a single frequency.

As shown in FIG. 3, the waveform generation unit 161 can generate microwaves having a plurality of frequency components by generating a continuous signal by performing inverse discrete Fourier transform on N-number of complex data symbols. A method of generating such a signal may be the same as an orthogonal frequency-division multiple access (OFDMA) modulation method used in digital television broadcasting or the like (see, e.g., Japanese Patent No. 5320260).

In one example, the waveform generation unit 161 has waveform data expressed by a pre-digitalized code sequence. The waveform generation unit 161 quantizes the waveform data and applies inverse Fourier transform to the quantized data to generate I data and Q data. Then, the waveform generation unit 161 applies digital/analog (D/A) conversion to each of the I data and the Q data to obtain two analog signals. The waveform generation unit 161 inputs the analog signals to a low pass filter (LPF) through which only a low frequency component passes. The waveform generation unit 161 mixes the two analog signals outputted from the LPF with the microwaves from the PLL oscillator and the microwaves having a phase difference of 90° with respect to the microwaves from the PLL oscillator. Then, the waveform generation unit 161 combines the microwaves generated by the mixing. Accordingly, the waveform generation unit 161 generates microwaves having one or more frequency components.

The output of the waveform generation unit 161 is connected to the attenuator 163. The power control unit 162 is connected to the attenuator 163. The power control unit 162 may be, e.g., a processor. The power control unit 162 controls an attenuation rate of the microwaves in the attenuator 163 such that the microwaves outputted from the microwave output device 16 have power corresponding to the setting power designated by the controller 100. The output of the attenuator 163 is connected to the mode transducer 166 through the amplifiers 164 and 165. The amplifiers 164 and 165 are configured to amplify the microwaves at given amplification factors. The mode transducer 166 is configured to convert a mode of the microwaves outputted from the amplifier 165. The microwaves generated by the mode conversion in the mode transducer 166 are outputted as output microwaves of the microwave generation unit 16a.

The output of the microwave generation unit 16a is connected to one end of the waveguide 16b. The other end of the waveguide 16b is connected to a first port 171 of the circulator 16c. The circulator 16c includes the first port 171, a second port 172 and a third port 173. The circulator 16c is configured to allow microwaves inputted into the first port 171 to be outputted from the second port 172 and the microwaves inputted into the second port 172 to be outputted from the third port 173. One end of the waveguide 16d is connected to the second port 172 of the circulator 16c. The other end of the waveguide 16d serves as an output unit 16t of the microwave output device 16.

One end of the waveguide 16e is connected to the third port 173 of the circulator 16c. The other end of the waveguide 16e is connected to the dummy load 16j. The dummy load 16j is configured to receive and absorb microwaves propagating through the waveguide 16e. The dummy load 16j converts the microwaves into heat, for example.

The first directional coupler 16f is configured to split microwaves (i.e., traveling waves) that are outputted from the microwave generation unit 16a and propagate to the output unit 16t. The first detection unit 16g detects a first detection value indicating the power of the traveling waves split by the first directional coupler 16f.

The second directional coupler 16h is configured to split microwaves (i.e., reflection waves) that have returned to the output unit 16t. The second detection unit 16i detects a second detection value indicating the power of the reflection waves split by the second directional coupler 16h. The first detection unit 16g and the second detection unit 16i are examples of a detection device.

The first and the second detection unit 16g and 16i are connected to the power control unit 162. The first detection unit 16g outputs the first detection value to the power control unit 162. The second detection unit 16i outputs the second detection value to the power control unit 162. The power control unit 162 controls the attenuator 163 such that a difference, i.e., a load power, between the first detection value and the second detection value coincides with the setting power designated by the controller 100. If necessary, the power control unit 162 controls the waveform generation unit 161.

In the first example, the first directional coupler 16f is interposed between one end and the other end of the waveguide 16b. The second directional coupler 16h is interposed between one end and the other end of the waveguide 16e.

(Second Example of the Microwave Output Device)

Figure 4:
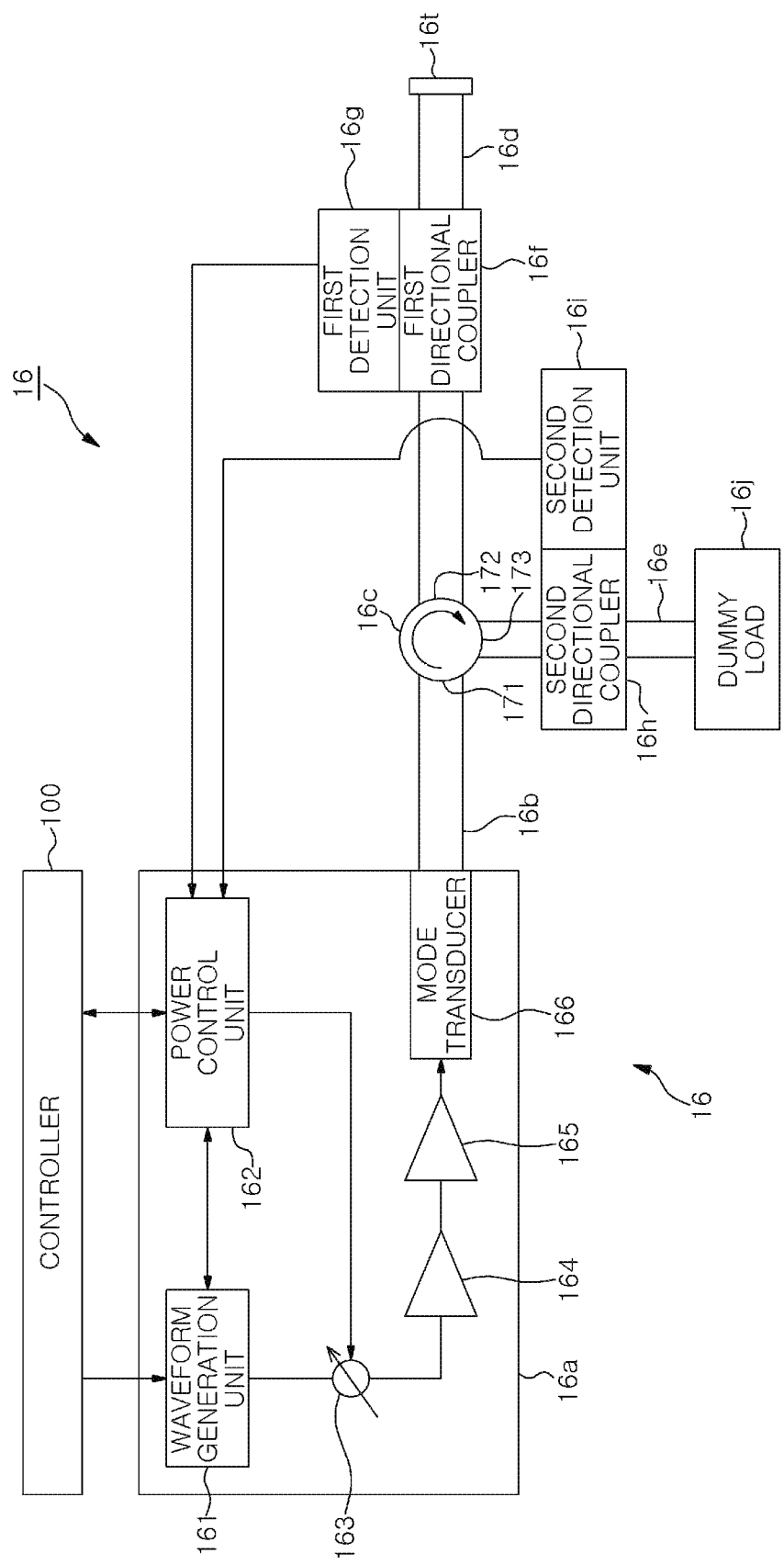
FIG. 4 shows a second example of the microwave output device.

FIG. 4 shows the second example of the microwave output device 16. As shown in FIG. 4, the second example of the microwave output device 16 is different from the first example of the micro output device 16 in that the first directional coupler 16f is interposed between one end and the other end of the waveguide 16d.

(Third Example of the Microwave Output Device)

Figure 5:
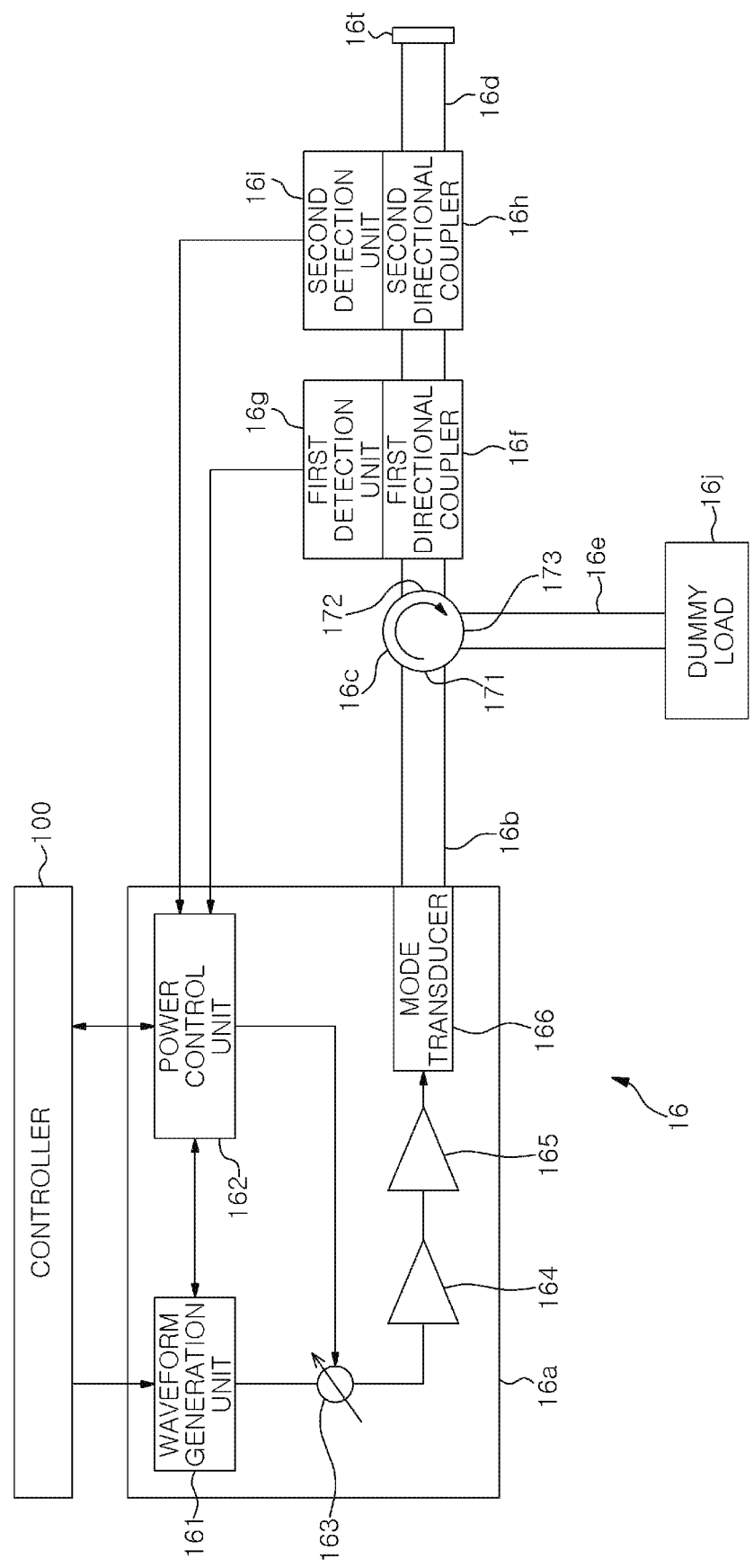
FIG. 5 shows a third example of the microwave output device.

FIG. 5 shows the third example of the microwave output device 16. As shown in FIG. 5, the third example of the microwave output device 16 is different from the first example of the microwave output device 16 in that both the first directional coupler 16f and the second directional coupler 16h are interposed between one end and the other end of the waveguide 16d.

(Fourth Example of the Microwave Output Device)

Figure 6:
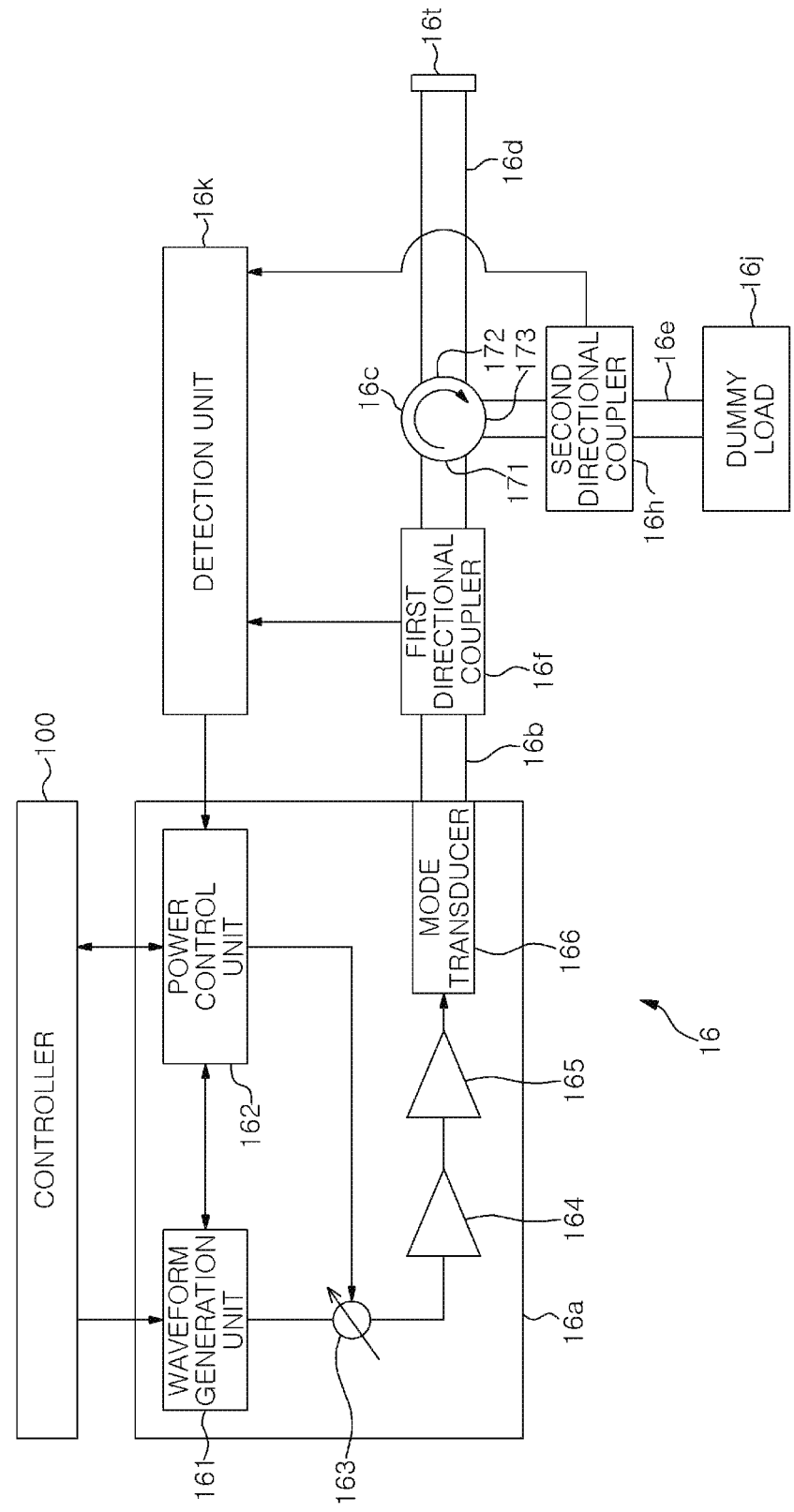
FIG. 6 shows a fourth example of the microwave output device.

FIG. 6 shows the fourth example of the microwave output device 16. As shown in FIG. 6, the fourth example of the microwave output device 16 is the same as the first example of the microwave output device 16 except that it includes a detection unit 16k in which the first detection unit 16g and the second detection unit 16i are formed as one unit.

Hereinafter, the configuration examples of the first detection unit 16g, the second detection unit 16i, and the detection unit 16k of the microwave output device 16 will be described.

(Configuration Example of the First Detection Unit)

Figure 7:
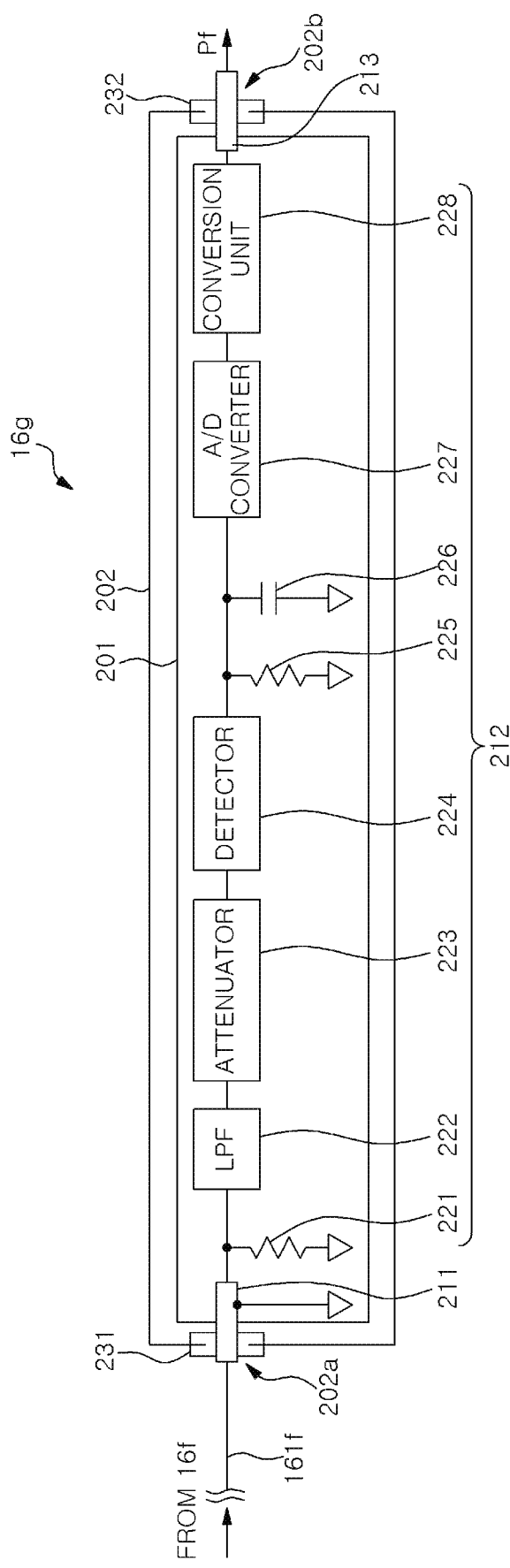
FIG. 7 shows a configuration example of a first detection unit.

FIG. 7 shows a configuration example of the first detection unit 16g. As shown in FIG. 7, the first detection unit 16g includes a substrate 201 and a housing 202. A connector 211, a detection circuit 212, and an output port 213 are disposed on the substrate 201.

The connector 211 is connected to a transmission line 161f through which the traveling waves split by the first directional coupler 16f are transmitted. Further, the connector 211 is connected to the ground.

The detection circuit 212 converts the traveling waves inputted from the transmission line 161f via the connector 211 to a first detection value Pf indicating the power of the traveling waves. The detection circuit 212 includes a resistor element 221, an LPF 222, an attenuator 223, a detector 224, a resistor element 225, a capacitor 226, an A/D converter 227, and a conversion unit 228. One end of the resistor element 221 is connected to an output of the connector 211 and an input of the LPF 222, and the other end of the resistor element 221 is connected to the ground. The LPF 222 has a given transmission bandwidth and removes high frequency components that are not within the given transmission bandwidth from the traveling waves inputted from the transmission line 161*f* via the connector 211. The attenuator 223 attenuates the traveling waves from which the high frequency components are removed by the LPF 222 at a given attenuation rate. The detector 224 generates an analog signal (voltage signal) corresponding to the power of the traveling waves attenuated by the attenuator 223. One end of the resistor element 225 and one end of the capacitor 226 are connected to an output of the detector 224 and an input of the A/D converter 227, respectively. The other end of the resistor element 225 and the other end of the capacitor 226 are connected to the ground. The A/D converter 227 converts the analog signal generated by the detector 224 to a digital value. The conversion unit 228 is, e.g., a processor such as a CPU or the like, and converts the digital value obtained by the A/D converter 227 to the first detection value Pf.

The output port 213 outputs the first detection value Pf obtained by the detection circuit 212 to the power control unit 162

The housing 202 accommodates therein the substrate 201. The housing 202 has, e.g., a container and a lid. By fixing the container and the lid by screws or the like, an inner space for accommodating the substrate 201 is formed in the housing 202. The housing 202 serves as a shield for preventing microwaves of the substrate 201 from leaking to the outside of the housing 202 and a shield for preventing electromagnetic waves outside of the housing 202 from intruding into the housing 202. Since electromagnetic shielding is performed in the housing 202, the container and the lid are in close contact with each other. A connector opening 202*a* and an output port opening 202*b* are formed at the housing 202. The substrate 201 is accommodated in the housing 202 in a state where the connector 211 is inserted into the connector opening 202*a* and the output port 213 is inserted into the output port opening 202*b*. The connector opening 202*a* is an example of a first opening, and the output port opening 202*b* is an example of a second opening.

A first sealing member 231 for sealing the periphery of the connector 211 is provided at the connector opening 202*a* of the housing 202. A second sealing member 232 for sealing the periphery of the output port 213 is provided at the output port opening 202*b* of the housing 202.

In the plasma processing apparatus 1, in order to improve assemblability of the first detection unit 16*g*, given gaps exist between an inner wall surface of the connector opening 202*a* and the connector 211 and between an inner wall surface of the output port opening 202*b* and the output port 213. In the first detection device 16*g*, moisture in the air may intrude into the housing 202 through these gaps. The moisture that has intruded into the housing 202 is absorbed by the substrate 210 accommodated in the housing 202. The moisture absorbed by the substrate 201 affects the characteristics of the detection circuit 212 disposed on the substrate 201, which results in deterioration of the detection accuracy of the power of the microwaves (traveling waves).

Figure 8:
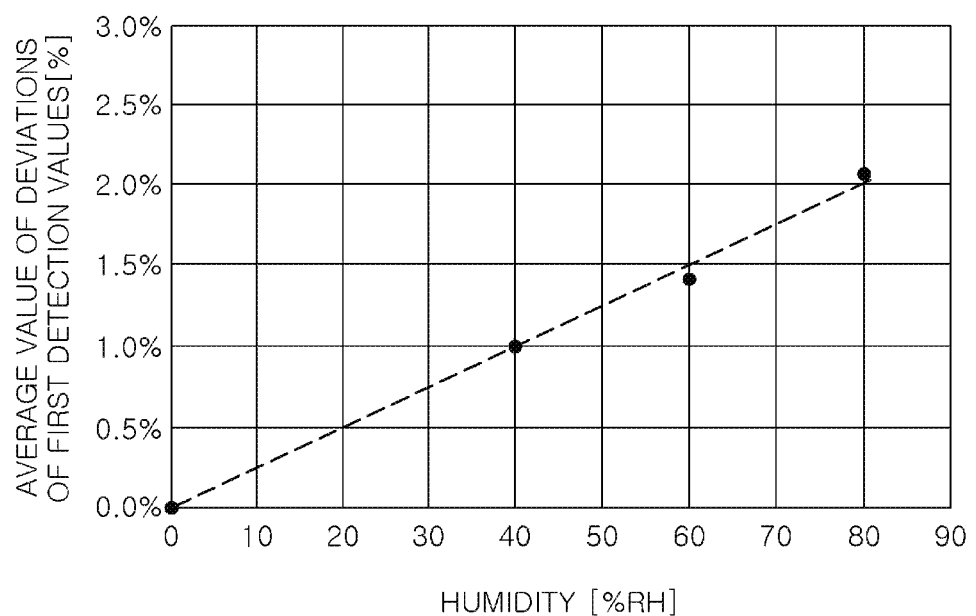
FIG. 8 shows an example of a relationship between humidity of air in a housing and variation of a first detection value detected by the first detection unit.

FIG. 8 shows an example of the relationship between a humidity of air in the housing 202 and an average value of the deviations of the first detection values detected by the first detection unit 16*g*. FIG. 8 shows a result obtained by measuring the average value [%] of the deviations of the first detection values with respect to the average value of the first detection values while changing the humidity [% RH] of the air in the housing 202. Here, the average value of the first detection value indicates the power of the traveling waves detected using a power meter prepared based on a specific standard. In this detection, the temperature of the detection circuit 212 in the housing 202 is maintained at a specified temperature and, thus, there is no variation of the first detection value due to the temperature. Further, in this detection, the humidity in the housing 202 was increased or decreased. When the humidity was increased, the first detection value was smaller than the average value. When the humidity was decreased, the first detection value was greater than the average value. This causes hysteresis and leads to the deviations of the first detection values. In FIG. 8, the average value of the detected first detection values was calculated. As the average value of the deviations of the first detection values with respect to the average value of the first detection values is increased, the detection accuracy of the power of the traveling waves (microwaves) is decreased. As shown in FIG. 8, the average value of the deviations of the first detection values with respect to the average value of the first detection values is increased as the humidity of the air in the housing 202 is increased. When the humidity in the housing 202 is 0% RH, the variation of the first detection value can be minimized.

The inventor of the present disclosure has intensively conducted research based on the detection result shown in FIG. 8 and has found the following aspects.

Even when the humidity around the substrate 201 is changed, the change in the moisture absorbed by the substrate is gradual over time.

The surface resistance and the dielectric constant of the substrate 201 are changed depending on the moisture that intrudes into the housing 202 and is absorbed by the substrate 201.

The changes in the surface resistance and the dielectric constant of the substrate 201 affect the characteristics of the detection circuit 212 disposed on the substrate 201. Particularly, the characteristics of the elements (i.e., the LPF 222 and the attenuator 223) through which microwaves directly flow among the elements constituting the detection circuit 212 are easily affected by the changes in the surface resistance and the dielectric constant of the substrate 201. For example, the transmission bandwidth of the LPF 222 may be affected by the changes in the surface resistance and the dielectric constant of the substrate 201. The attenuation rate of the attenuator 223 may be affected by the changes in the surface resistance of the substrate 201.

When the characteristics of the elements (i.e., the LPF 222 and the attenuator 223) through which the microwaves directly flow are affected, the deviation of the first detection values detected by the first detection unit 16*g* increases.

Therefore, in the plasma processing apparatus 1, the container forming the inner space of the housing 202 accommodating the substrate 201 is brought into close contact with the lid. In addition, the first sealing member 231 is provided at the connector opening 202*a* and the second sealing member 232 is provided at output port opening 202*b*. Accordingly, moisture can be prevented from intruding into the housing 202 and being absorbed by the substrate 201.

Therefore, in the plasma processing apparatus 1, it is possible to suppress the changes in the surface resistance and the dielectric constant of the substrate 201 by the moisture absorbed by the substrate 201. Accordingly, the influence on the characteristics of the detection circuit 212 disposed on the substrate 201 can be suppressed. As a result, the detection accuracy of the power of the traveling waves (microwaves) can be improved.

In the plasma processing apparatus 1, a moisture absorbent such as silica gel or the like may be disposed in the housing 202 to further prevent moisture from being absorbed by the substrate 201. The moisture absorbent is preferably disposed near the elements (i.e., the LPF 222 and the attenuator 223) through which microwaves directly flow among the elements constituting the detection circuit 212. Alternatively, the inner space of the housing 202 may be dried by supplying dry air into the housing 202.

Generally, the substrate 201 has a protective film such as a solder resist or the like on the surface on which the connector 211, the detection circuit 212 and the output port 213 are disposed, and does not have a protective film on an end surface where the connector 211, the detection circuit 212 and the output port 213 are not disposed. Therefore, in the plasma processing apparatus 1, a sealing film may be formed on the end surface of the substrate 201 where the connector 211, the detection circuit 212 and the output port 213 are not disposed. Accordingly, it is possible to prevent the moisture from being absorbed from the end surface of the substrate 201.

(Configuration Example of the Second Detection Unit)

Figure 9:
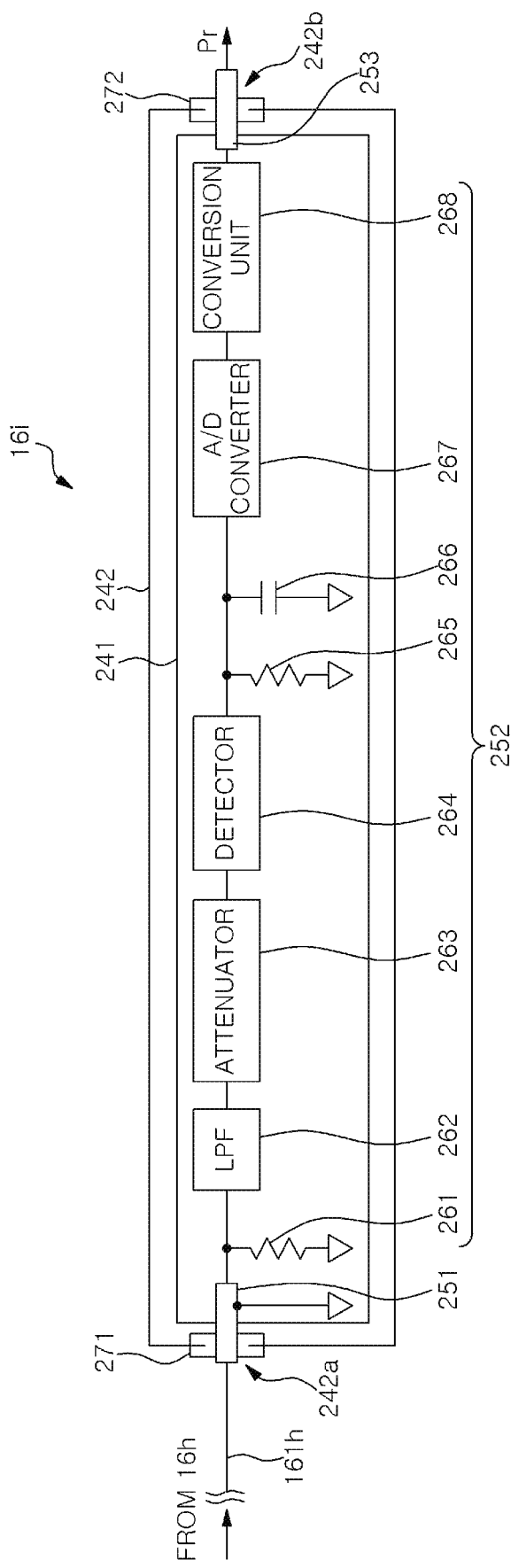
FIG. 9 shows a configuration example of a second detection unit.

FIG. 9 shows a configuration example of the second detection unit 16i. As shown in FIG. 9, the second detection unit 16i has a substrate 241 and a housing 242. A connector 251, a detection circuit 252, and an output port 253 are disposed on the substrate 241.

The connector 251 is connected to a transmission line 161h through which the reflection waves split by the second directional coupler 16h are transmitted. Further, the connector 251 is connected to the ground.

The detection circuit 252 converts the reflection waves inputted from the transmission line 161h via the connector 251 to a second detection value Pr indicating the power of the reflection waves. The detection circuit 252 includes a resistor element 261, an LPF 262, an attenuator 263, a detector 264, a resistor element 265, a capacitor 266, an A/D converter 267, and a conversion unit 268. One end of the resistor element 261 is connected to an output of the connector 251 and an input of the LPF 262. The other end of the resistor element 261 is connected to the ground. The LPF 262 has a given transmission bandwidth, and removes high frequency components that are not within the given transmission bandwidth from the reflection waves inputted from the transmission line 161h via the connector 251. The attenuator 263 attenuates the reflection waves from which the high frequency components are removed by the LPF 262 at a given attenuation rate. The detector 264 generates an analog signal (voltage signal) corresponding to the power of the reflection waves attenuated by the attenuator 263. One end of the resistor element 265 and one end of the capacitor 266 are connected to the output of the detector 264 and an input of the A/D converter 267, respectively. The other end of the resistor element 265 and the other end of the capacitor 266 are connected to the ground. The A/D converter 267 converts the analog signal generated by the detector 264 to a digital value. The conversion unit 268 is, e.g., a processor such as a CPU or the like, and converts the digital value obtained by the A/D converter 267 to the second detection value Pr.

The output port 253 outputs the second detection value Pr obtained by the detection circuit 252 to the power control unit 162.

The housing 242 accommodates the substrate 241. The housing 242 has, e.g., a container and a lid. By fixing the container and the lid by screws or the like, an inner space for accommodating the substrate 241 is formed in the housing 242. The housing 242 serves as a shield for preventing microwaves of the substrate 241 from leaking to the outside of the housing 242 and a shield for preventing electromagnetic waves outside of the housing 242 from intruding into the housing 242. Since the electromagnetic shielding is performed in the housing 242, the container and the lid are in close contact with each other. A connector opening 242a and an output port opening 242b are formed at the housing 242. The substrate 241 is accommodated in the housing 242 in a state where the connector 251 is inserted into the connector opening 242a and the output port 253 is inserted into the output port opening 242b. The connector opening 242a is an example of a third opening, and the output port opening 242b is an example of a fourth opening.

A third sealing member 271 for sealing the periphery of the connector 251 is provided at the connector opening 242a of the housing 242. A fourth sealing member 272 for sealing the periphery of the output port 253 is provided at the output port opening 242b of the housing 242.

In the plasma processing apparatus 1, in order to improve assemblability of the second detection unit 16i, given gaps exist between an inner wall surface of the connector opening 242a and the connector 251 and between an inner wall surface of the output port opening 242b and the output port 253. In the second detection unit 16i, moisture in the air may intrude into the housing 242 through these gaps. The moisture that has intruded into the housing 242 is absorbed by the substrate 241 accommodated in the housing 242. The moisture absorbed by the substrate 241 affects the characteristics of the detection circuit 252 disposed on the substrate 241, which results in deterioration of the detection accuracy of the power of the reflection waves (microwaves).

Therefore, in the plasma processing apparatus 1, the container that defines the inner space of the housing 242 accommodating the substrate 241 is brought into close contact with the lid. In addition, the third sealing member 271 is provided at the connector opening 242a, and the fourth sealing member 272 is provided at the output port opening 242b. Accordingly, it is possible to prevent moisture from intruding into the housing 242 and being absorbed by the substrate 241.

Therefore, in the plasma processing apparatus 1, it is possible to suppress the changes in the surface resistance and the dielectric constant of the substrate 241 by the moisture absorbed by the substrate 241. Accordingly, the influence on the characteristics of the detection circuit 252 disposed on the substrate 241 can be suppressed. As a result, the detection accuracy of the power of the reflection waves (microwaves) can be improved.

In the plasma processing apparatus 1, a moisture absorbent such as silica gel or the like may be disposed inside the housing 242 to further prevent moisture from being absorbed by the substrate 241. The moisture absorbent is preferably disposed near the elements (i.e., the LPF 262 and the attenuator 263) through which the microwaves directly flow among the elements constituting the detection circuit 252. Alternatively, the inner space of the housing 242 may be dried by supplying dry air into the housing 242.

Generally, the substrate 241 has a protective film such as a solder resist or the like on the surface on which the connector 251, the detection circuit 252 and the output port 253 are disposed, and does not have a protective film on an end surface where the connector 251, the detection circuit 252 and the output port 253 are not disposed. Therefore, in the plasma processing apparatus 1, a sealing film may be formed on the end surface of the substrate 241 where the connector 251, the detection circuit 252 and the output port 253 are not disposed. Accordingly, it is possible to prevent the moisture from being absorbed from the end surface of the substrate 241.

(Configuration Example of Detection Unit)

Figure 10:
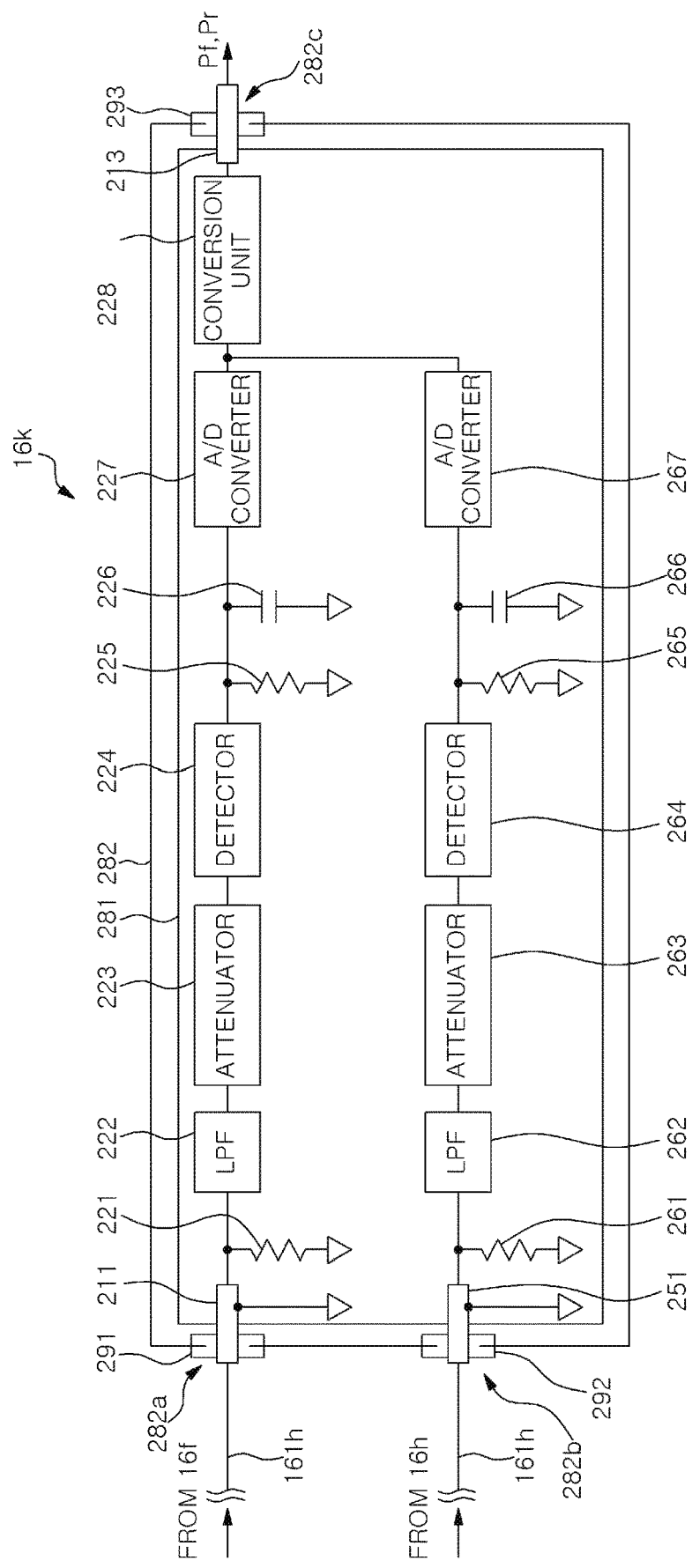
FIG. 10 shows a configuration example of a detection unit.

FIG. 10 shows a configuration example of the detection unit 16k. As described above, the detection unit 16k is formed by integrating the first detection unit 16g and the second detection unit 16i. In FIG. 10, like reference numerals will be used for like parts as the first detection unit 16g shown in FIG. 7 and the second detection unit 16i shown in FIG. 9. Redundant description thereof will be omitted, and differences will be mainly described. As shown in FIG. 10, the detection unit 16k has a substrate 281 and a housing 282. The connector 211, the resistor 221, the LPF 222, the attenuator 223, the detector 224, the resistor 225, the capacitor 226, the A/D converter 227, the conversion unit 228, and the output port 213 are disposed on the substrate 281. Further, the connector 251, the resistor 261, the LPF 262, the attenuator 263, the detector 264, the resistor 265, the capacitor 266, and the A/D converter 267 are disposed on the substrate 281. The resistor element 221, the LPF 222, the attenuator 223, the detector 224, the resistor element 225, the capacitor 226, the A/D converter 227, the conversion unit 228, the resistor element 265, the capacitor 266 and the A/D converter 267 constitute the detection circuit. The detection circuit converts the traveling waves inputted from the transmission line 161f via the connector 211 to the first detection value Pf indicating the power of the traveling waves, and converts the reflection waves inputted from the transmission line 161h via the connector 251 to the second detection value Pr indicating the power of the reflection waves. In other words, in the detection circuit, the conversion unit 228 converts the digital value obtained by the A/D converter 227 to the first detection value Pf, and converts the digital value to the second digital value Pr obtained by the A/D converter 267.

The output port 213 outputs the first detection value Pf and the second detection value Pr obtained by the conversion unit 228 to the power control unit 162.

The housing 282 accommodates the substrate 281. The housing 282 has, e.g., a container and a lid. By fixing the container and the lid by screws or the like, an inner space for accommodating the substrate 281 is formed in the housing 282. The housing 282 serves as a shield for preventing microwaves of the substrate 281 from leaking to the outside of the housing 282 and a shield for preventing electromagnetic waves outside of the housing 282 from intruding into the housing 282. Since electromagnetic shielding is performed in the housing 282, the container and the lid are in close contact with each other. Connector openings 282a and 282b, and an output port opening 282c are formed at the housing 282. The substrate 281 is accommodated in the housing 282 in a state where the connector 211 is inserted into the connector opening 282a; the connector 251 is inserted into the connector opening 282b; and the output port 213 is inserted into the output port opening 282c.

A fifth sealing member 291 for sealing the periphery of the connector 211 is provided at the connector opening 282a of the housing 282. A sixth sealing member 292 for sealing the periphery of the connector 251 is provided at the connector opening 282b of the housing 282. A seventh sealing member 293 for sealing the periphery of the output port 213 is provided at the output port opening 282c of the housing 282.

In the plasma processing apparatus 1, in order to improve assemblability of the detection unit 16k, given gaps exist between an inner wall surface of the connector opening 282a and the connector 211, between an inner wall surface of the connector opening 282b and the connector 251, and between an inner wall surface of the output port opening 282c and the output port 213. In the detection unit 16k, moisture in the air may intrude into the housing 282 through these gaps. The moisture that has intruded into the housing 282 is absorbed by the substrate 281 accommodated in the housing 282. The moisture absorbed by the substrate 281 affects the characteristics of the detection circuit disposed on the substrate 281, which results in deterioration of the detection accuracy of the power of the traveling waves and the reflection waves (microwaves).

Therefore, in the plasma processing apparatus 1, the container that defines the inner space of the housing 282 accommodating the substrate 281 is brought into close contact with the lid. In addition, the fifth sealing member 291 is provided at the connector opening 282a; the sixth sealing member 292 is provided at the connector opening 282b; and the seventh sealing member 293 is provided at the output port opening 282c. Accordingly, it is possible to prevent moisture from intruding into the housing 282 and being absorbed by the substrate 281.

Therefore, in the plasma processing apparatus 1, it is possible to suppress the changes in the surface resistance and the dielectric constant of the substrate 281 by the moisture absorbed by the substrate 281. Accordingly, the influence on the characteristics of the detection circuit disposed on the substrate 281 can be suppressed. As a result, the detection accuracy of the power of the traveling waves and the reflection waves (microwaves) can be improved.

In the plasma processing apparatus 1, a moisture absorbent such as silica gel or the like may be disposed in the housing 282 to further prevent moisture from being absorbed by the substrate 281. The moisture absorbent is preferably disposed near the elements (i.e., the LPF 222, the attenuator 223, the LPF 262, and the attenuator 263) through which microwaves directly flow among the elements constituting the detection circuit. Alternatively, the inner space of the housing 282 may be dried by supplying dry air into the housing 282.

Generally, the substrate 281 has a protective film such as a solder resist or the like on the surface on which the connector, the detection circuit, and the output port are disposed, and does not have a protective film on an end surface where the connector, the detection circuit, and the output port are not disposed. Therefore, in the plasma processing apparatus 1, a sealing film may be formed on the end surface of the substrate 281 where the connector, the detection circuit, and the output port are not disposed. Accordingly, it is possible to prevent the moisture from being absorbed from the end surface of the substrate 281.

(Configuration Example of Tuner)

Figure 11:
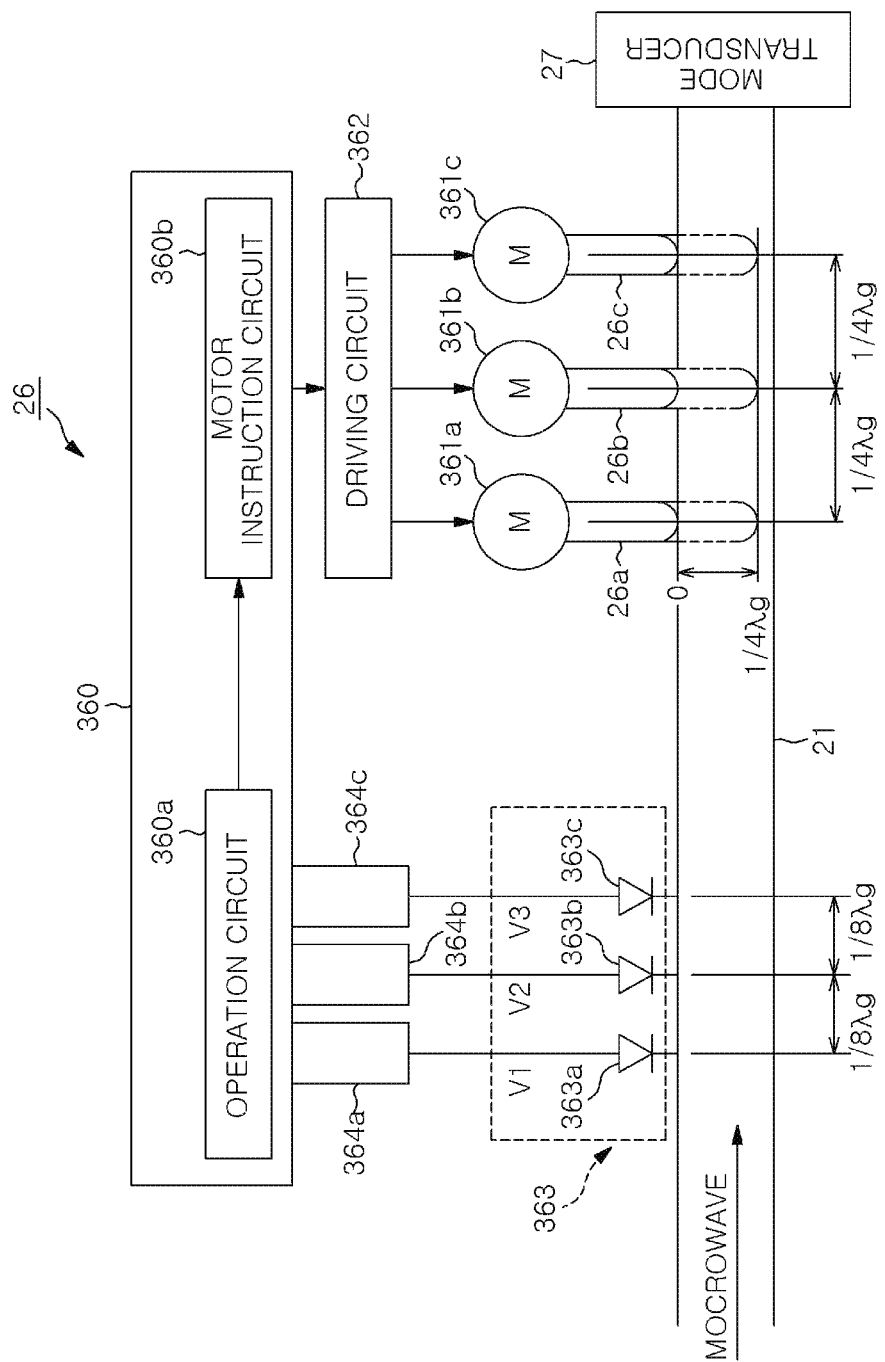
FIG. 11 shows a configuration example of a tuner.

Hereinafter, a configuration example of the tuner 26 will be described. FIG. 11 shows a configuration example of the tuner 26. As shown in FIG. 11, the tuner 26 is configured as a three-stub tuner. The three-stub tuner has three split waveguides. On the assumption that a guide wavelength is λg, the three split waveguides are disposed in the waveguide 21 at an interval of λg/4 in the traveling direction of the microwaves. Stubs 26a, 26b, and 26c are disposed in the split waveguides. The stubs 26a to 26c can adjust the amount of projection into the inner space of the waveguide 21 within a range from 0 to λg/4. Motors 361a, 361b, and 361c are connected to the stubs 26a, 26b, and 26c corresponding thereto, respectively. The amount of projection of the stubs 26a to 26c is adjusted based on a control signal of a driving circuit 362 for driving the motors 361a to 361c. When the positions of the stubs 26a, 26b and 26c in the split waveguide are changed, the characteristic impedance of the waveguide 21 is changed. By using this principle, the load impedance obtained by adding the impedance of the tuner 26 to the load can be matched with the impedance of the microwave output device 16.

The tuner 26 includes a tuner detection unit 363 and a tuner control unit 360. The tuner detection unit 363 is installed at the waveguide 21 closer to the microwave output device 16 than to the stubs 26a to 26c. The tuner detection unit 363 is, e.g., a three-probe detector, and includes three probes 363a, 363b, and 363c having diodes. The probes 363a to 363c are disposed on the waveguide 21 at an interval of λg/8 in the traveling direction of the microwaves. The probes 363a to 363c respectively detect voltage signals V1, V2, and V3 corresponding to the power of the microwaves propagating through the waveguide 21 and respectively output the detected voltage signals V1 to V3. The voltage signals V1 to V3 are outputted to the tuner control unit 360 via corresponding A/D converters 364a, 364b and 364c. The probes 363a to 363c are examples of the detection circuit. The voltage signals V1 to V3 are examples of the detection value.

The probes 363a to 363c are disposed on a substrate (not shown). A plurality of output ports for outputting the voltage signals V1 to V3 from the probes 363a to 363c are disposed on the substrate on which the probes 363a to 363c are disposed. The substrate on which the probes 363a to 363c and the output ports are arranged is accommodated in the housing of the tuner detection unit 363. In other words, a plurality of probe openings and a plurality of output port openings are formed at the housing of the tuner detection unit 363. The probe openings are examples of a fifth opening, and the output port openings are examples of a sixth opening. The substrate is accommodated in the housing of the tuner detection unit 363 in a state where portions of the probes 363a to 363c, e.g., probe parts thereof, are inserted into the probe openings and wiring connected to the output ports are inserted into the output port openings. The wiring is, e.g., a connector. A fifth sealing member for sealing a periphery of the portion of each of the probes 363a to 363c is provided at each of the probe openings. A sixth sealing member for sealing the periphery of the wiring is provided at each of the output port openings.

The tuner control unit 360 includes an operation circuit 360a and a motor instruction circuit 360b. The operation circuit 360a obtains a detection value of a reflection coefficient based on the voltage signals V1 to V3 outputted from the probes 363a to 363c. On the assumption that a reflection coefficient (complex reflection coefficient) observed at the position of the tuner detection unit 363 with respect to the standing waves (traveling waves and reflection waves) of the microwaves propagating through the waveguide 21 is Γ, the voltage signals V1 to V3 are expressed by the following Eq. 1.

(Eq. 1)

$$V1 = K|Vi|^2(1+|\Gamma|^2+2|\Gamma|\cos\theta)$$

$$V2 = K|Vi|^2(1+|\Gamma|^2-2|\Gamma|\sin\theta)$$

$$V3 = K|Vi|^2(1+|\Gamma|^2-2|\Gamma|\cos\theta) \quad (1)$$

K indicates a proportional constant (detection sensitivity). Vi indicates an incident wave amplitude. |Γ| and θ indicate an absolute value and a phase of the reflection coefficient Γ, respectively.

The operation circuit 360a performs calculation expressed by the following Eq. 2 on the voltage signals V1 to V3 to obtain a cosine product Vc and a sine product Vs related to the reflection coefficient Γ.

(Eq. 2)

$$Vc = V1 - V3 = 4 \cdot K \cdot |Vi|^2 |\Gamma| \cos\theta$$

$$Vs = V1 + V3 - 2 \cdot V2 = 4 \cdot K \cdot |Vi|^2 |\Gamma| \sin\theta \quad (2)$$

The motor instruction circuit 360b drives the driving circuit 362 based on the cosine product Vc and the sine product Vs to control the impedance in a feedback manner.

In the plasma processing apparatus 1, in order to improve assemblability of the tuner detection unit 363, given gaps exist between inner wall surfaces of the probe openings and parts of the probes 353a to 363c and between inner wall surfaces of the output port openings and the output ports. Moisture in the air may intrude into the housing of the tuner detection unit 363 through these gaps. The moisture that has intruded into the housing of the tuner detection unit 363 is absorbed by the substrate accommodated in the housing of the tuner detection unit 363. The moisture absorbed by the substrate affects characteristics of the probes 363a to 363c disposed on the substrate, which results in deterioration of the detection accuracy of the voltage signals V1 to V3.

Therefore, in the plasma processing apparatus 1, the fifth sealing member is provided at each of the probe openings in the housing of the tuner detection unit 363, and the sixth sealing member is provided at each of the output port openings. Accordingly, it is possible to prevent moisture from intruding into the housing of the tuner detection unit 363 and being absorbed by the substrate.

Therefore, in the plasma processing apparatus 1, it is possible to suppress the changes in the surface resistance and the dielectric constant of the substrate by the moisture absorbed by the substrate. Accordingly, the influence on the characteristics of the probes 363a to 363c disposed on the substrate can be suppressed. As a result, the detection accuracy of the voltage signals V1 to V3 can be improved.

The detection device (e.g., the first detection unit 16g) according to one embodiment includes the substrate 201, the housing 202, the first sealing member 231, and the second sealing member 232. The connector 211, the detection circuit 212, and the output port 213 are disposed on the substrate 201. The connector 211 is connected to the transmission line 161f for microwaves (traveling waves). The detection circuit 212 converts the traveling waves inputted from the transmission line 161f via the connector 211 to the first detection value Pf indicating the power of the traveling waves. The output port 213 outputs the first detection value Pf obtained by the detection circuit 212. The connector opening 202a and the output port opening 202b are formed at the housing 202. The substrate 201 is accommodated in the housing 202 in a state where the connector 201 is inserted into the connector opening 202a and the output port 213 is inserted into the output port opening 202b. The first sealing member 231 is provided at the connector opening 202a of the housing 202 and seals the periphery of the connector 211. The second sealing member 232 is provided at the output port opening 202b of the housing 202 and seals the periphery of the output port 213.

Accordingly, the detection device (e.g., the first detection unit 16g) can improve the detection accuracy of the power of the microwaves (e.g., the traveling waves).

While various embodiments have been described, the present disclosure can be variously modified without being limited to the above-described embodiments.

For example, in the above-described embodiments, the detection device (e.g., the first detection unit 16g) is applied to the microwave output device 16 for generating microwaves using the microwave generation unit 16a. However, the present disclosure is not limited thereto. The detection device (e.g., the first detection unit 16g) may be applied to a microwave output device for generating microwaves using another microwave generation source. For example, a magnetron is used as a microwave generation source.

For example, in the above-described embodiments, the connector or the output port is inserted to the opening of the housing. However, the present disclosure is not limited thereto. For example, a transmission line (e.g., the transmission line 161f) such as a cable or the like connected to the connector or the output port may be inserted into the opening of the housing. In that case, the periphery of the transmission line may be sealed by a sealing member.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A detection device comprising:
a substrate on which a connector connected to a transmission line for microwaves, a detection circuit configured to convert the microwaves inputted from the transmission line via the connector to a detection value indicating power of the microwaves, and an output port configured to output the detection value obtained by the detection circuit are disposed;
a housing that has a first opening and a second opening and accommodates the substrate in a state where the connector is inserted into the first opening and the output port is inserted into the second opening;
a first sealing member provided at the first opening of the housing to seal a periphery of the connector; and
a second sealing member provided at the second opening of the housing to seal a periphery of the output port.

2. The detection device of claim 1, wherein a moisture absorbent is disposed in the housing.

3. The detection device of claim 1, wherein the substrate has a sealing film that seals an end surface of the substrate where the connector, the detection circuit, and the output port are not disposed.

4. The detection device of claim 2, wherein the substrate has a sealing film that seals an end surface of the substrate where the connector, the detection circuit, and the output port are not disposed.

5. A microwave output device comprising:
a microwave generation unit configured to generate microwaves;
an output unit configured to output the microwaves propagating from the microwave generation unit;
a first directional coupler configured to split traveling waves that are the microwaves propagating from the microwave generation unit toward the output unit; and
a first detection unit configured to detect a first detection value indicating power of the traveling waves split by the first directional coupler,
wherein the first detection unit includes:
a substrate on which a connector connected to a transmission line for the traveling waves, a detection circuit configured to convert the traveling waves inputted from the transmission line via the connector to the first detection value, and an output port configured to output the first detection value obtained by the detection circuit are disposed;
a housing that has a first opening and a second opening and accommodates the substrate in a state where the connector is inserted into the first opening and the output port is inserted into the second opening;
a first sealing member provided at the first opening of the housing to seal a periphery of the connector; and
a second sealing member provided at the second opening of the housing to seal a periphery of the output port.

6. The microwave output device of claim 5, further comprising:
a second directional coupler configured to split reflection waves that are microwaves that have returned to the output unit; and
a second detection unit configured to detect a second detection value indicating power of the reflection waves split by the second directional coupler,
wherein the second detection unit include:
a substrate on which a connector connected to a transmission line for the reflection waves, a detection circuit configured to convert the reflection waves inputted from the transmission line via the connector to the second detection value, and an output port configured to output the second detection value obtained by the detection circuit are disposed;
a housing that has a third opening and a fourth opening and accommodates the substrate in a state where the connector is inserted into the third opening and the output port is inserted into the fourth opening;
a third sealing member provided at the third opening of the housing to seal a periphery of the connector; and
a fourth sealing member provided at the fourth opening of the housing to seal a periphery of the output port.

7. A plasma processing apparatus comprising:
a chamber body; and
the microwave output device of claim 5.

8. The plasma processing apparatus of claim 7, wherein the microwave output device further includes:
a second directional coupler configured to split reflection waves that are microwaves that have returned to the output unit; and
a second detection unit configured to detect a second detection value indicating power of the reflection waves split by the second directional coupler,
wherein the second detection unit includes:
a substrate on which a connector connected to a transmission line for the reflection waves, a detection circuit configured to convert the reflection waves inputted from the transmission line via the connector to the second detection value, and an output port configured to output the second detection value obtained by the detection circuit are disposed;

a housing that has a third opening and a fourth opening and accommodates the substrate in a state where the connector is inserted into the third opening and the output port is inserted into the fourth opening;
a third sealing member provided at the third opening of the housing to seal a periphery of the connector; and
a fourth sealing member provided at the fourth opening of the housing to seal a periphery of the output port.

9. A plasma processing apparatus comprising:
a chamber body; and
a microwave output device configured to output microwaves for exciting a gas supplied into the chamber body,
wherein the microwave output device includes:
a microwave generation unit configured to generate the microwaves;
an output unit configured to output the microwaves propagating from the microwave generation unit; and
a tuner configured to match the microwaves propagating from the microwave generation unit toward the output unit;
wherein the tuner includes:
a tuner detection unit configured to detect voltage distribution in a waveguide where the tuner is disposed,
wherein the tuner detection unit includes:
a substrate on which a detection circuit configured to detect a voltage signal indicating the voltage distribution and an output port configured to output a detection value obtained by the detection circuit are disposed;
a housing that has a fifth opening and a sixth opening and accommodates the substrate in a state where a part of the detection circuit is inserted into the fifth opening and wiring connected to the output port is inserted into the sixth opening;
a fifth sealing member provided at the fifth opening of the housing to seal the part of the detection circuit; and
a sixth sealing member provided at the sixth opening of the housing to seal a periphery of the wiring.

10. The plasma processing apparatus of claim 9, wherein the wiring is a connector.

* * * * *